United States Patent [19]

Reynolds

[11] Patent Number: 5,206,792

[45] Date of Patent: Apr. 27, 1993

[54] ATTACHMENT FOR CONTACTING A HEAT SINK WITH AN INTEGRATED CIRCUIT CHIP AND USE THEREOF

[75] Inventor: Scott D. Reynolds, Endwell, N.Y.

[73] Assignee: International Business Machines Corporation, Armonk, N.Y.

[21] Appl. No.: 787,132

[22] Filed: Nov. 4, 1991

[51] Int. Cl.⁵ .............................................. H05K 7/20
[52] U.S. Cl. .................................... 361/386; 361/388; 257/713; 257/718
[58] Field of Search ...................... 357/383, 386–389, 357/74, 79, 81; 174/16.3; 165/80.3, 185

[56] References Cited

U.S. PATENT DOCUMENTS 4,147,889  4/1979  Andrews et al. ................... 361/388
4,504,886  3/1985  Cygan et al. ........................ 361/386
5,065,279  11/1991  Lazenby et al. ..................... 361/388

Primary Examiner—Gregory D. Thompson
Attorney, Agent, or Firm—Pollock, Vande Sande & Priddy

[57] ABSTRACT

An attachment for removably thermally contacting a heat sink with an integrated circuit chip located on a chip carrier which in turn is located on an integrated circuit card or board containing a body portion for contacting the chip, flange members extending from the body portion. Each of the flange members contains a pad-like member located at the end for contacting with the card or board. A compliant portion is present that extends away from the body portion for contacting the heat sink.

31 Claims, 4 Drawing Sheets

ATTACHMENT FOR CONTACTING A HEAT SINK WITH AN INTEGRATED CIRCUIT CHIP AND USE THEREOF

TECHNICAL FIELD

The present invention is concerned with an attachment for removably and thermally contacting a heat sink with an integrated circuit chip located on a chip carrier which in turn is located on a card or board, and is especially concerned with an attachment that is suitable for use with a relatively high power card having multiple TAPE AUTOMATED BONDING (TAB) sites. The present invention is concerned with an attachment that serves to provide physical protection during manufacture along with facilitating heat transfer upon contact with a heat sink. The attachment of the present invention is designed to facilitate TAB rework, failure analysis, card burn in and testing of individual chips.

BACKGROUND ART

The prior art describes numerous package configurations for semiconductor chips. In fact, more recently, the cost of such packages has, in various instances, become greater than the cost of the chips. In order to overcome this cost problem, a technique known as TAPE AUTOMATED BONDING (TAB) packaging has been introduced. It is especially useful with lower costs, relatively low powered dissipation integrated circuits. TAB packaging involves the use of a web of material, generally called a carrier tape such as a polyimide, to carry electrically conductive leads which provide connections between the chip and a printed circuit card. The carrier chip is incremented past a number of operating stations, one of which places a chip on an inner-cluster of conductive leads. The inner-cluster is then bonded to connecting pads on the chip. The tape is then incremented to a station where the active face of the chip, including the inner-lead bonds, may be coated with a passivating material. The tape is then moved to a further station where the outer cluster of leads on the carrier tape is severed from the tape. The tape/chip combination is then registered with conductive pads residing on an underlying circuit board or card and the outer leads are bonded to the conductive pads. The circuit board or card/chip combination is then available for additional processing. TAB packaging is relatively inexpensive compared to the other package configurations now presently available.

One of the drawbacks of TAB packaging is that its use has for the most part been limited to low power dissipation circuits, since it is quite difficult to apply heat sinks to a TAB package structure. The primary, if not only, physical interconnection between a chip and an underlying circuit board in a TAB package is via bonds between the tape-carried outer leads and the underlying conductive pads on the circuit board. Attaching a heat sink to the chip in a TAB package is somewhat impractical since, in the event of mechanical vibration or strain, the chip will tend to pull away from the circuit board or card and the exerted forces may exceed the ultimate rupture strength of the lead bonds or the tape itself.

Another problem associated with employing heat sinks with TAB packages is supporting the heat sinks in a relatively inexpensive manner, while still retaining good heat dissipation characteristics. Physical interconnections to supports that are separate from the underlying circuit board have made removal of the circuit board difficult. Attempts to provide physical interconnections to the board itself have resulted in different problems. For instance, circuit boards are often subject to flexure when they are inserted or withdrawn from mating connectors, which can cause cracking, breaking or failure of inflexible physical connection to a heat sink.

Although, various prior art suggestions to provide heat dissipation have been employed, such are primarily suitable for relatively low power dissipating packages whereby the chips dissipate one watt or less per chip. For the most part, TAB structures that are designed to dissipate at least two watts per chip, have not had entirely satisfactory heat dissipating techniques provided to the structure. This is especially true when attempting to cool the underlying chips by simple natural convection airflow as contrasted to forced airflow or refrigeration. Even heat dissipating techniques that have been somewhat successful for the relatively high power dissipation circuit have not been entirely satisfactory. For instance, such are not readily removable from the chip without causing damage to the chip or circuitry or requiring higher head space than desired.

SUMMARY OF INVENTION

The present invention provides an attachment to thermally connect a heat sink with an integrated circuit chip located on a chip carrier whereby the heat sink is removable non-destructively from the chip carrier. The chip carrier in turn is located on a circuit board or circuit card. Moreover, the present invention provides an attachment that is suitable for relatively high power cards or boards. The present invention serves to physically protect the TAB packaging during fabrication or manufacture as well as facilitating heat transfer upon contact with the heat sink. The attachment can be non-destructively removable from the card or the board. This removable aspect of the attachment of the present invention provides for rework of the TAB packaging when necessary, failure analysis, card burn in and testing.

In particular, the present invention is concerned with an attachment for removably and thermally contacting a heat sink with an integrated circuit chip located on a chip carrier. The carrier in turn is located on an integrated circuit card or board. The attachment of the present invention includes a body portion for contacting the integrated circuit chip. Extending from the body portion are a plurality of flange members. Each of the flange members contains a pad-like member that is located at its end farthest from the body portion. The pad-like members are for contact with the integrated circuit card or board. In addition, extending away from the body portion is a compliant portion for contacting the heat sink. The body portion, flange members, padlike member and compliant portion are thermally conducting.

In addition, the present invention is concerned With an integrated circuit package that contains a heat sink, integrated circuit chip located on a chip carrier, which in turn is located on an integrated circuit card or board and the above-described attachment that is in thermal contact with the heat sink and integrated circuit chip.

BEST AND VARIOUS MODES FOR CARRYING OUT INVENTION

Figure 3:
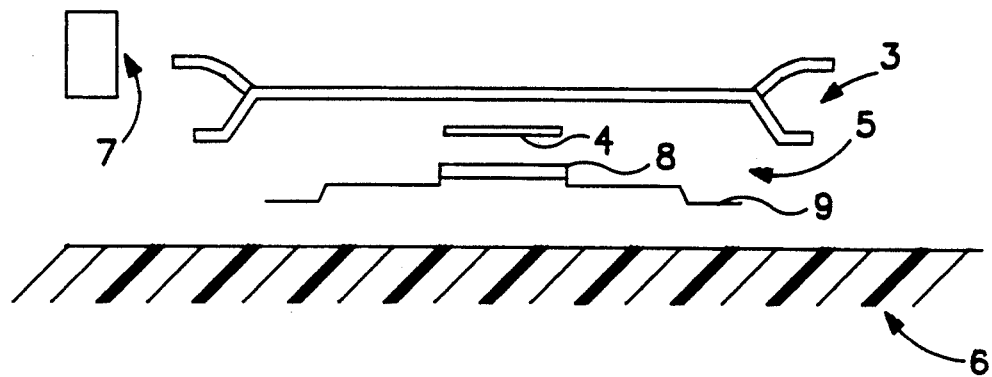
FIG. 3 is a schematic diagram in unassembled form of an integrated circuit package employing an attachment pursuant to the present invention.
Figure 4:
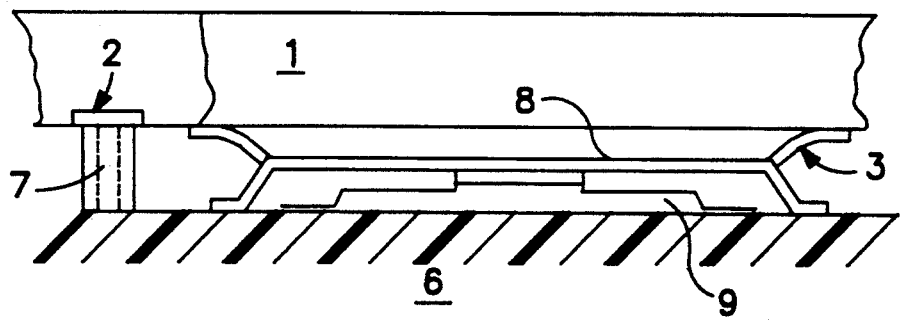
FIG. 4 is a schematic diagram in assembled form of an integrated circuit package employing an attachment pursuant to the present invention.

In order to facilitate an understanding of the present invention, reference is made to the figures. In particular, in FIGS. 3 and 4, numeral 1 is a heat sink, which can be of any particular desired configuration. Numeral 2 represents a fastening means such as a screw or snap which secures the heat sink 1 to circuit card or board 6. A stand-off or collar 7 is located between the circuit card 6 and heat sink 1 in order to maintain the heat sink and card to be substantially parallel to each other, limit the amount of free play and/or tolerance built up between the stands and heat sink, and to prevent excessive physical forces being exerted upon attachment 3. The collar 7 can be an independent part or can be integral with the heat sink. Attached to circuit card 6 is a TAB package 5 that includes an integrated circuit chip 8 and flexible substrate or chip carrier such as a polyimide 9. Of course, other flexible substrates or chip carrier such as DECAL can be used, when desired. Located between heat sink 1 and TAB package 5 and card 6 is attachment 3. Attachment 3 can be secured to integrated circuit chip s by various methods including, but not limited to, adhesive 4.

The attachment 3 and heat sink 1 can be non-destructively removable from the card or board 6, with the heat sink 1 also being non-destructively removable from the attachment 3. However, in most cases the attachment 3 will not be non-destructively removable from the chip 8, unless special precautions are employed such as providing gold, copper or silver plating on the chip with direct soldering to the attachment or use of a removable adhesive.

Figure 1:
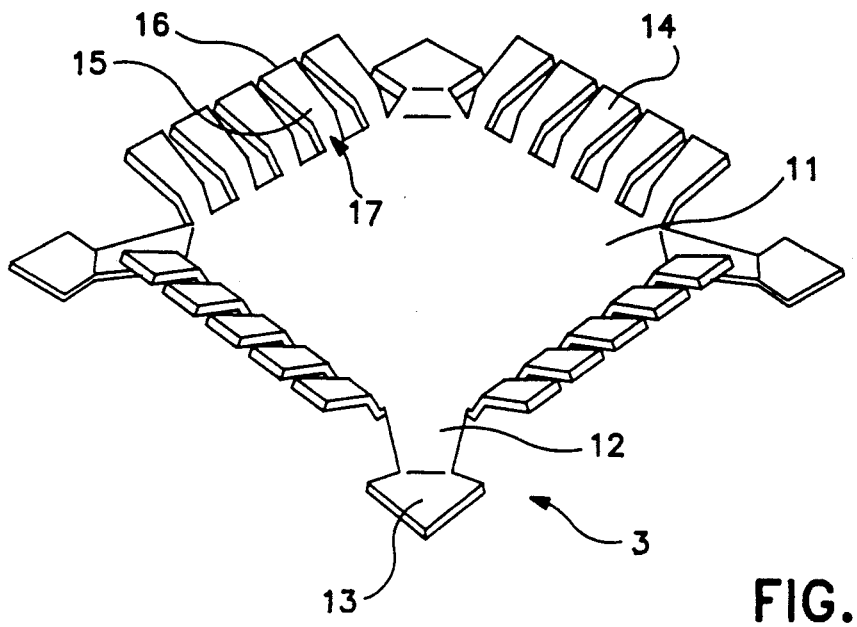
FIG. 1 is an isometric view of an attachment pursuant to the present invention.

Reference to FIG. 1 demonstrates a preferred embodiment of an attachment pursuant to the present invention. Attachment 3 includes a body portion 11 constructed of a thermally conductive material. The body portion 11 is also preferably a relatively springy material. Preferred springy materials exhibit Rockwell Hardness of at least approximately B90 and tensile strength of at least approximately 90,000 psi. Suitable materials include steel, copper, and copper alloys such as brass and phosphorous bronze. The surface area of the body portion 11 is larger than the size of the chip to which it is to be subsequently contacted and is typically slightly less than (e.g. at least about 80%) the surface area of the TAB to which the chip is attached. For a square TAB having sides of about 0.7 inch, a typical size body portion is about 0.55 inch to about 0.7 inch, more typically about 0.65 inch. The body portion is typically about 0.01 inch to about 0.02 inch in thickness and more typically about 0.015 inch in thickness. Thicknesses less than about 0.01 inch can result in undesirable bowing of the attachment; whereas, thicknesses greater than about 0.02 inch can result in undesirable rigidity or lack of compliancy of the attachment for attachments of the body sizes disclosed above. Employing a body portion having a surface area at least about 80% of the TAB facilitates reworking of a chip, if needed, by facilitating the flow of, for example, hot air down onto solder joints to aid in removal of the chip from the TAB.

A plurality of flange members 12 (at least two) and preferably four or more extend out from the body portion and are directed towards the circuit card or board 6 to which the attachment is to be contacted. At the distal end or that end farthest from the body portion 11 is present a pad-like member on each of the flange means. Pad-like members 13 are for contact with the integrated circuit card or board 6. Preferably, flange members 12 and pad-like members 13 are constructed of the same material as body portion 11, and in any event are thermally conductive and preferably springy. Each flange member 12 is preferably tapered towards the pad-like member 13 to provide for the added flexibility for bending to properly angle the pad-like member to be parallel with the card or board without placing excessive force at the base portion. The taper is preferably a linear taper resulting in about a 50% to about 60% reduction in the width of the flange member. A typical flange member being about 0.12 inches wide at the intersection with the base and being tapered down to about 0.067 inch at the intersection with the pad-like member. Also, in a typical arrangement each flange member is about 0.11 inch to about 0.17 inch long and more typically about 0.13 inch long, and creating a distance of about 0.04 inch to about 0.06 inch and more typically about 0.5 inch from the card or board to the bottom of body portion 11. The flange members are preferably about 0.01 inch to about 0.02 inch thick, and preferably are formed integral with the body portion such as being cut, stamped and formed for one piece of the sheet metal.

The pad-like members 13 extend beyond the TAB but are located as close to the TAB as possible without physically interfering with it. Typically, the pad-like member is about 0.10 to about 0.17 inch and more typically about 1.2 inch per side to provide the desired contact with the integrated circuit board or card 6. The pad-like members are preferably about 0.01 inch to about 0.02 inch thick. Each pad-like member 13 is angled with respect to flange member 12 so that it is capable of contacting the circuit board or circuit card in a planar manner. The preferred angle created between the intersecting surfaces from flange member 12 and its pad-like portion 13 is about 15° to about 25°. A typical angle between intersecting planes of the body portion 11 and flange member 12 is about 15° to about 25°. Also desirably included is a means for attaching or bonding the pad-like members 13 to the card 6. For example, that surface of the pad-like member that is to contact the circuit card 6 can include a thermosetting adhesive such as those disclosed in U.S. Pat. No. 5,028,984, disclosure of which is incorporated herein by reference. However, instead of a thermosetting adhesive, other modes of attachment of the pad-like member to card 6 can be employed. Examples of such include solderable pins provided through the card, solderable clips or pins on the pad-like members or a metal plating such as a copper plating on the pad-like member and/or card to which the pad member is to be soldered in order to facilitate a reworkable attachment.

It should be understood that the above dimensions are merely typical and will vary depending upon the size of the TAB. Also, the shape of an attachment will preferably approximate the shape of the TAB. For example the attachment will be square for a square TAB, and rectangular for a rectangular TAB.

In addition, an adhesive, preferably the same as that used on the pad-like members, is provided on that surface of body portion 11 that is to contact the integrated circuit chip and can be provided in only that general area of the body portion that is to contact the chip.

The attachment 3 also includes a compliant portion 14 that extends away from the body portion 11 in a direction for contacting the heat sink. The compliant portion 14 provides for thermally conductive contact for high-efficiency heat transfer from the chip area to the heat sink as well as providing a combination for significant tolerance inconsistencies that may result from card run-out, poor vertical spacing, heat sink bow, stand tilt, and other problems that typically are experienced in assembling TAB packaging. In addition, the interface between the finger contact area and the heat sink may be thermally enhanced by providing at this interface a compliant and thermally conductive material such as a silicone grease containing a thermally conductive filler such as zinc oxide. This modification can compensate for less than perfect finger contact.

In the embodiment shown, compliant portion 14 is constructed of a plurality of individual finger-like members. The compliant portion is also thermally conductive and is preferably constructed of the same material as the body portion.

Figure 2:
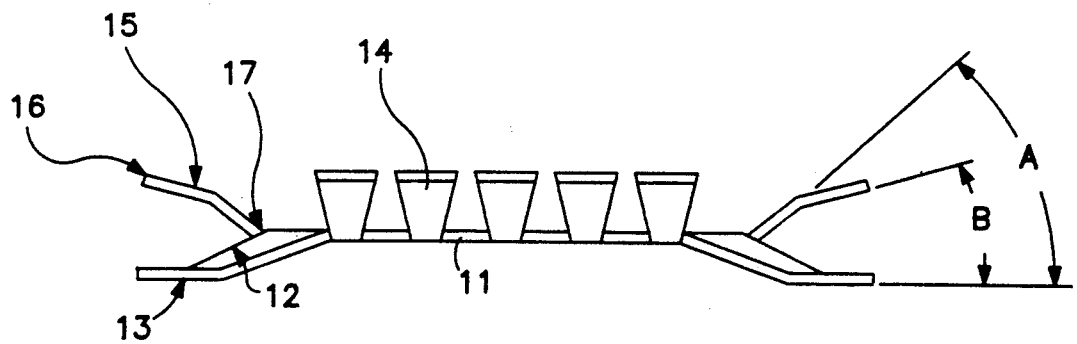
FIG. 2 is a side view of an attachment pursuant to the present invention.

According to preferred aspects of the present invention, the finger-like members are tapered towards the body portion 11 and also include a bend 15 in addition to being angled at its intersection with the body portion. The tapering of the fingers is to facilitate bending or angling thereof as close as possible to the body portion area without placing excessive force on the body portion. The finger-like members are tapered from the end 16 farthest from the body portion 11 towards bend 15 and body portion 11, and are greatest in width at the farthest end 16 for enhanced contact with heat sink 1. Typically the finger-like members are linearly tapered from end 16 to bend 17 (FIG. 2) to about 60% to about 65% of its width. Although not mandatory, the finger-like members are preferably tapered all the way from the end of the fingers to the body portion. In a typical arrangement, the finger-like member forms an angle A at the intersection with the body portion of about 37° to about 45° and an angle B at the bend 15 of about 13° to about 21° and more typically about 17° from the horizontal. The portion of the finger-like members from the body portion to the bend 15 rises at a much steeper rate than the portion from bend 15 outward. For instance, the vertical rise for the first portion is typically about 0.08 to about 0.12 inch more typically about 0.107 inch and the total vertical rise for the second portion is typically about 0.078 to about 0.118 inch and more typically about 0.098 inch.

The compliant portion 14 can be provided by other means such as employing in place of or in conjunction with the finger-like members a compliant and thermally conductive material such as foam rubber having oriented wires distributed therein to provide the necessary conductivity, thermally-filled elastomers, wire mesh, wool fabrics, and conductive springs such as leaf springs or radial finger contact springs. Various of these materials such as the elastomers, wire mesh and wire wools are commercially available from Tecknit.

Figure 5:
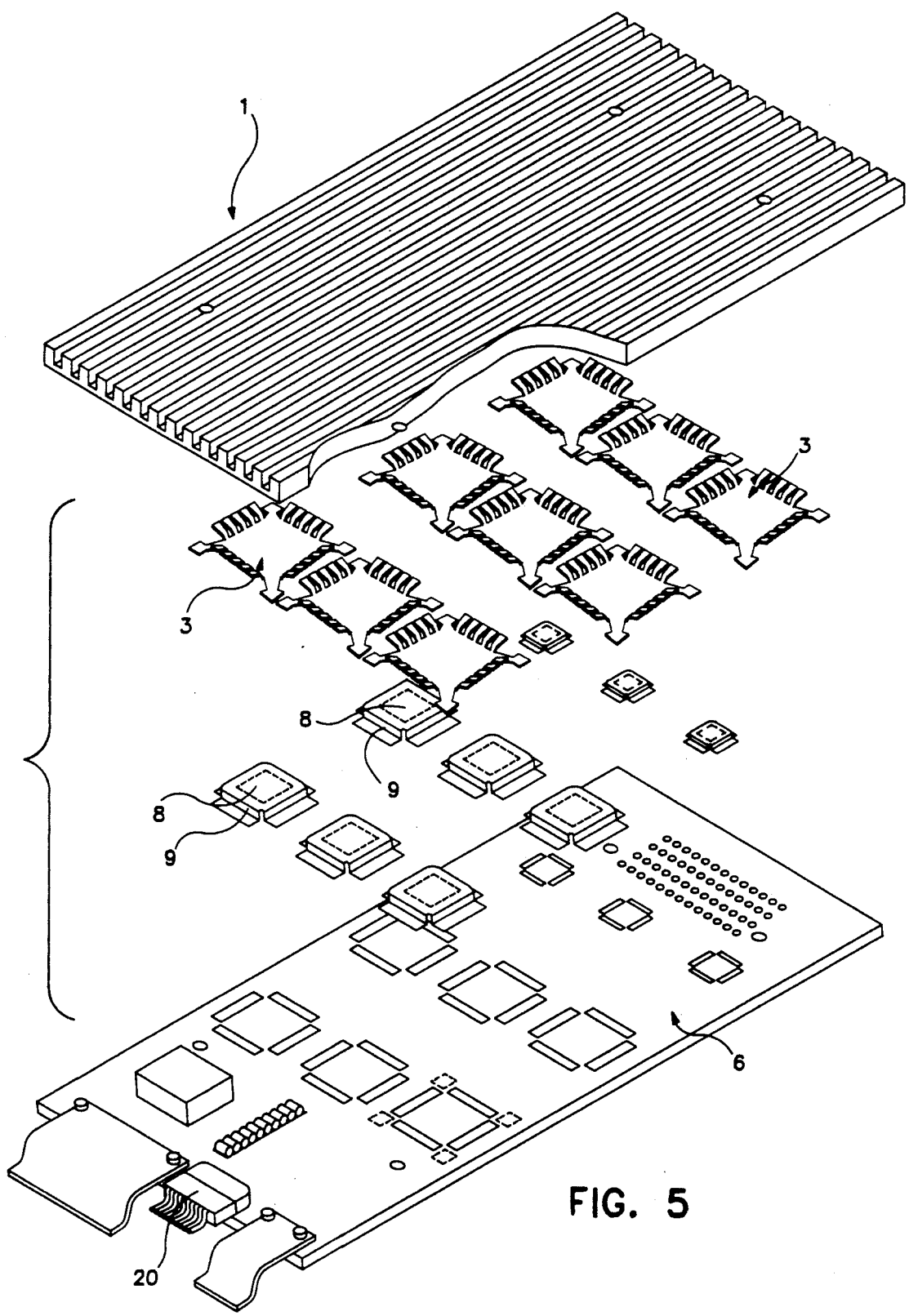
FIG. 5 is an exploded view of an integrated circuit package employing a plurality of chips and attachments pursuant to the present invention.

FIG. 5 is an exploded view of a structure that includes a plurality of semiconductor chips 8, each one associated with its individual attachment 3 pursuant to the present invention. Each attachment 3 as shown in FIG. 5 can be contacted with a common heat sink 1, which is one of the advantages of the present invention.

By utilizing a common heat sink, the area exposed to cooling airflow, when used, is maximized because no real estate is needed for space between devices, attachment means and the like.

In FIG. 5, numeral 20 represents an electrical interconnection for connecting the card 6 with an external power source (not shown). In the alternative, each attachment 3 can be contacted with its own individual heat sink, if so desired.

Figure 6:
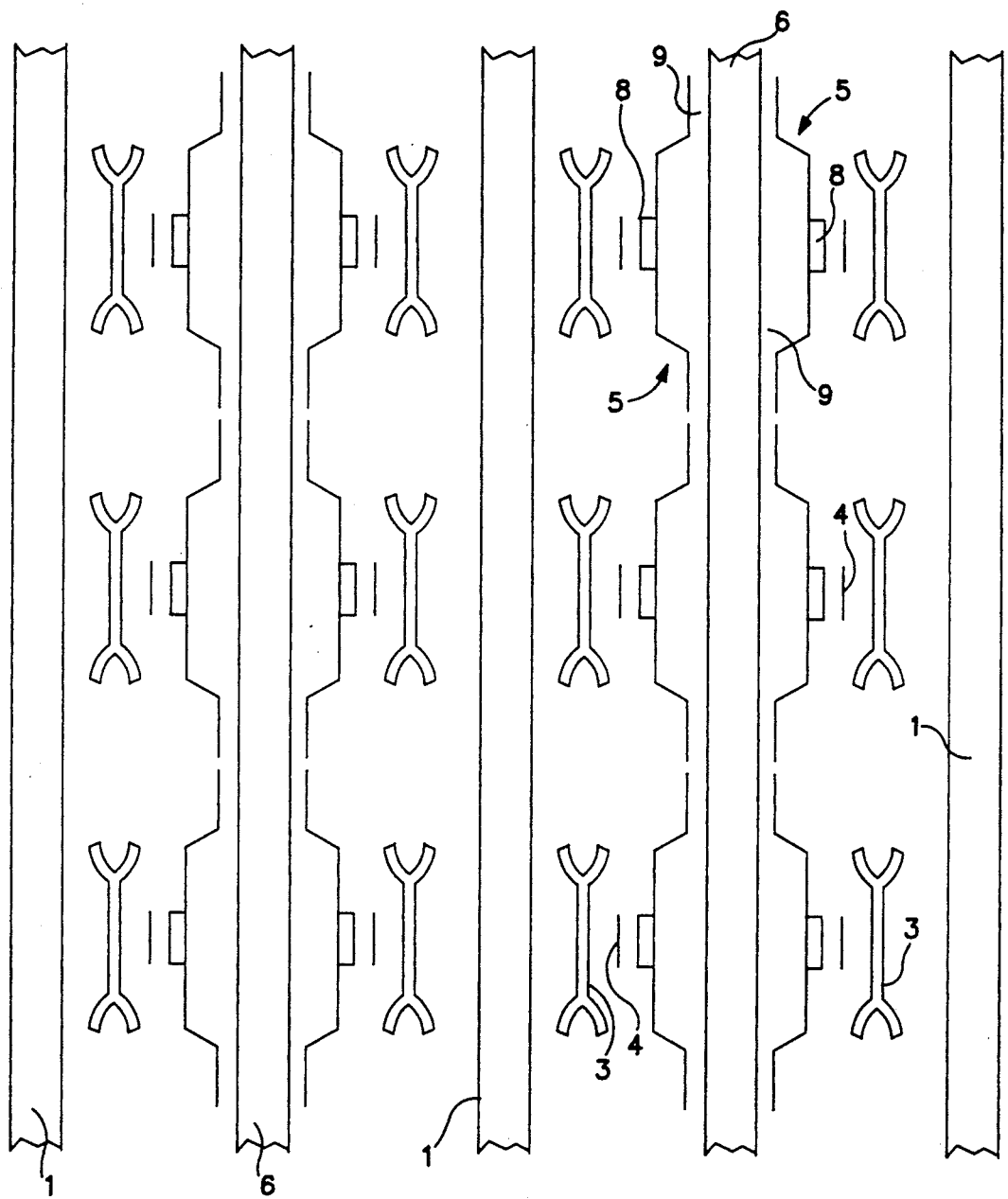
FIG. 6 is an exploded view of a packaging arrangement employing attachments of the present invention.

It is further contemplated that the board or card can include a plurality of TABS on both of its major surfaces along with the attachment of the present invention and a heat sink. Also, the attachments of the present invention make it possible to provide packaging that includes a plurality of circuit boards or circuit cards with a common heat sink located between adjacent boards or cards. For example, see FIG. 6 for such an arrangement in its exploded view. In particular, a plurality of circuit boards or cards 6 are present, each having a plurality of TAB packages 5 that include an integrated chip s and flexible substrate 9 on both major surfaces of the board or card. Opposed each major surface of each board or card 6 is a heat sink 1 such as cold plate (liquid cool) or heat pipe since cooling air could not reach the sandwiched heat sink. Adjacent boards or cards 6 preferably share a heat sink located there between. Located between each heat sink 1 and TAB package 5 and card 6 is an attachment 3 of the present invention.

An integrated circuit package, pursuant to the present invention, can be fabricated by providing a thermosetting adhesive on that surface of body portion 11 that is to contact the semiconductor chip and by providing a thermosetting adhesive on that surface of each pad-like member that is to contact the circuit card. The attachment is then forced in wet contact with the integrated circuit chip and card. The attachment is then heated in those areas containing adhesive with thermodes to cause the adhesive to flow and assure the necessary bonding. Next, the card and attached attachment is cured in an oven, for example, at about 100° C. to about 200° C., more typically about 120° C. for about 15 to about 180 minutes, more typically about 120 minutes.

What is claimed is:

1. An attachment for removably and thermally contacting a heat sink with an integrated circuit chip located on a chip carrier which is located on an integrated circuit card or board, said attachment comprises:
   a body portion for contacting the integrated circuit chip;
   a plurality of flange members extending from said body portion;
   each of said flange members containing a pad-like member located at its end farthest from said body portion, wherein said pad-like members being for contacting the integrated circuit card or board;

a compliant portion extending away from said body portion in a direction different from said flange members for contacting the heat sink;

and wherein said portion, said flange members, said pad-like members and said compliant portion are thermally conducting.

2. The attachment of claim 1 which comprises four flange members.

3. The attachment of claim 1 wherein said compliant portion includes a plurality of finger-like members.

4. The attachment of claim 1 wherein said body portion contains an adhesive located on the surface intended for contact with the integrated circuit chip.

5. The attachment of claim 4 wherein said pad-like members include adhesive located on the surface thereof intended to contact the circuit board or card.

6. The attachment of claim 1 wherein said body portion, flange members, compliant portion and pad-like members are formed as an integral member and are each about 0.01 inch to about 0.02 inch thick.

7. The attachment of claim 1 wherein each of said flange members is tapered towards said pad-like members.

8. The attachment of claim 3 wherein each of said finger-like members is tapered towards said body portion.

9. The attachment of claim 8 wherein each of said finger-like members includes a bend in addition to being angled at its intersection with said body portion.

10. The attachment of claim 7 wherein each of said finger-like members form an angle A at the intersection with the body portion of about 37° to about 45°, and an angle B at its bend of about 13° to about 21°.

11. The attachment of claim 1 being an integral structure.

12. An integrated circuit package comprising:
an integrated circuit chip located on a chip carrier which is located on an integrated circuit card or board;
a heat sink; and
an attachment interposed between said heat sink and said integrated circuit chip for removeably and thermally contacting said heat sink with said integrated circuit chip, said attachment including a body portion for contacting said integrated circuit chip, a plurality of flange members extending from said body portion, each of said flange members containing a pad-like member located at its end farthest from said body portion, wherein said pad-like members being for contacting said integrated circuit card or board, a compliant portion extending away from said body portion in a direction for contacting said heat sink, and wherein said body portion, said flange members, said pad-like members and said compliant portion are thermally conducting.

13. The integrated circuit package of claim 12 wherein said chip carrier is a flexible carrier.

14. The integrated circuit package of claim 12 wherein said chip carrier is a TAB.

15. The integrated circuit package of claim 12 that includes a plurality of integrated circuit chips each associated with an attachment of claim 1.

16. The integrated circuit package of claim 15 wherein each of said attachments is contacted with a common heat sink.

17. The integrated circuit package of claim 12 which includes a plurality of fastening means to connect said heat sink with said integrated circuit board or card.

18. The integrated circuit package of claim 17 that further includes a collar through which said fastening means passes for closely controlling the vertical dimensions between the heat sink and circuit card or board.

19. The integrated circuit package of claim 15 wherein a plurality of chips each associated with an attachment of claim 1 are located on both major surfaces of said board or card, and wherein a heat sink is located opposed to each of said major surfaces.

20. The integrated circuit package of claim 19 that comprises a plurality of boards or cards each having a plurality of chips on both major surfaces thereof with each chip being associated with its own individual attachment of claim 1, and having a heat sink located opposed each major surface of said boards or cards.

21. The integrated circuit package of claim 19 wherein adjacent boards or cards share a common heat sink located therebetween.

22. The integrated circuit package of claim 12 wherein said attachment is an integral structure.

23. The integrated circuit package of claim 12 wherein said attachment is substantially the same shape as said chip carrier.

24. The integrated circuit package of claim 12 wherein said chip is coated with a material to provide for the nondestructive removal of said attachment from said chip.

25. The attachment of claim 1 wherein said compliant portion is selected from the group consisting of foam rubber having oriented wires distributed therein; thermally-filled elastomers, wire mesh, wool fabrics and conductive springs.

26. The attachment of claim 3 wherein said finger-like members are provided with a thermally conductive material on the surface that is to interface with said heat sink.

27. The attachment of claim 1 wherein said compliant portion includes a plurality of finger-like members in combination with a member selected from the group consisting of foam rubber having oriented wires distributed therein; thermally-filled elastomers; wire mesh, wool fabrics and conductive springs.

28. A method for fabricating an integrated circuit chip package which comprises:
providing an attachment for interposing between heat sink and an integrated circuit chip and for removeably and thermally contacting said heat sink with said integrated circuit chip, said attachment including a body portion for contacting said integrated circuit chip, a plurality of flange members extending from said body portion, each of said flange members containing a pad-like member located at its end farthest from said body portion, wherein said pad like members being for contacting an integrated circuit card or board, a compliant portion extending away from said body portion in a direction for contacting said heat sink, and wherein said body portion, said flange members, said pad-like members and said compliant portion are thermally conducting;
providing said integrated circuit chip on a chip carrier;
providing said carrier on said integrated circuit card or board;

providing adhesive on that surface of the body portion of said attachment that is to contact said integrated circuit chip;

providing means for attaching said pad-like members to said circuit card or board;

bringing said attachment into contact with said integrated circuit chip and contacting said pad-like members with said integrated circuit chip;

then subjecting said card or board to elevated temperature in order to cause bonding of said attachment to said chip; and then attaching a heat sink such that said heat sink is in thermal contact with the compliant portion of said attachment.

29. The method of claim 28 wherein said chip carrier is a flexible carrier.

30. The method of claim 28 wherein said chip carrier is a TAB.

31. The method of claim 30 wherein a plurality of integrated circuit chips and attachments are located on said integrated circuit card or board and each of said integrated circuit chips secured to one of said attachments.